(12) United States Patent
Yueh et al.

(10) Patent No.: US 11,706,964 B2
(45) Date of Patent: Jul. 18, 2023

(54) ELECTRONIC DEVICE FOR TILING AND RELATED ELECTRONIC APPARATUS

(71) Applicant: InnoLux Corporation, Miao-Li County (TW)

(72) Inventors: Jui-Jen Yueh, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 17/471,128

(22) Filed: Sep. 9, 2021

(65) Prior Publication Data
US 2021/0408220 A1 Dec. 30, 2021

Related U.S. Application Data

(63) Continuation of application No. 16/354,158, filed on Mar. 14, 2019, now abandoned.

(51) Int. Cl.
*H10K 59/18* (2023.01)
*G06F 1/16* (2006.01)
*G06F 3/14* (2006.01)

(52) U.S. Cl.
CPC ........... *H10K 59/18* (2023.02); *G06F 1/1652* (2013.01); *G06F 3/1446* (2013.01)

(58) Field of Classification Search
CPC . H01L 27/3293; G06F 1/1652; G06F 3/1446; H10K 59/18
See application file for complete search history.

(56) References Cited

U.S. PATENT DOCUMENTS

| | | | |
|---|---|---|---|
| 2011/0057861 A1* | 3/2011 | Cok | H01L 51/5209 345/1.3 |
| 2012/0236509 A1* | 9/2012 | Cope | G09F 9/30 361/730 |
| 2016/0103649 A1* | 4/2016 | Yoshitani | G09G 3/20 345/694 |
| 2020/0387201 A1* | 12/2020 | Nakagawa | G06F 1/181 |

* cited by examiner

*Primary Examiner* — Stephen G Sherman
(74) *Attorney, Agent, or Firm* — Winston Hsu

(57) ABSTRACT

An electronic device comprises a supporting substrate, a flexible substrate disposed on the supporting substrate, a plurality of electronic units and a conductive pattern layer. The flexible substrate is bent from a front side to a back side of the supporting substrate, and a portion of the flexible substrate is disposed on the back side of the supporting substrate. The electronic units are disposed within a display region of the flexible substrate. The conductive pattern layer extends from the display region to the portion of the flexible substrate, and the conductive pattern layer electrically connects at least two of the electronic units.

8 Claims, 10 Drawing Sheets

ELECTRONIC DEVICE FOR TILING AND RELATED ELECTRONIC APPARATUS

CROSS REFERENCE TO RELATED APPLICATIONS

This application is a continuation application and claims priority of U.S. patent application Ser. No. 16/354,158, filed on Mar. 14, 2019, which is incorporated by reference in its entirety.

BACKGROUND OF THE DISCLOSURE

1. Field of the Disclosure

The present disclosure relates to an electronic device and an electronic apparatus, and more particularly, to an electronic device for tiling another electronic device.

2. Description of the Prior Art

Large or special-shaped electronic devices are often formed by tiling method (that is, many smaller electronic devices are combined to form a larger electronic device). For example, a large LED display board is combined by many small LED display boards. In order to achieve a flexible tiled LED display device, first of all, the flexible substrate should be used, in addition, it is necessary to solve the technical problems of connecting multiple flexible LED display boards together.

SUMMARY OF THE DISCLOSURE

An electronic device for tiling another electronic device of the present disclosure includes a supporting substrate having a first edge and a second edge, and a flexible substrate disposed on the supporting substrate, wherein the flexible substrate extends beyond the first edge and the second edge to define a first extension region and a second extension region of the flexible substrate, respectively.

An electronic device for tilling another electronic device includes a supporting substrate including a front side and a back side opposite to the front side, a flexible substrate disposed on the supporting substrate, a plurality of electronic units disposed on the flexible substrate and a conductive pattern layer disposed on the flexible substrate. The supporting substrate includes a first edge and a second edge, the flexible substrate extends beyond the first edge and the second edge to define a first extension region and a second extension region of the flexible substrate respectively, and the flexible substrate includes a display region excluding the first extension region and the second extension region. The flexible substrate is bent from the front side to the back side of the supporting substrate, and a portion of the flexible substrate is disposed on the back side of the supporting substrate. The plurality of electronic units are disposed within the display region. The conductive pattern layer extends from the display region to the portion of the flexible substrate, wherein the conductive pattern layer electrically connects at least two of the plurality of electronic units.

An electronic apparatus includes an electronic device tiled with another electronic device, each of the electronic device and the another electronic device includes a supporting substrate including a front side and a back side opposite to the front side, a flexible substrate disposed on the supporting substrate, a plurality of electronic units disposed on the flexible substrate and a conductive pattern layer disposed on the flexible substrate. The supporting substrate includes a first edge and a second edge, the flexible substrate extends beyond the first edge and the second edge to define a first extension region and a second extension region of the flexible substrate respectively, and the flexible substrate includes a display region excluding the first extension region and the second extension region. The flexible substrate is bent from the front side to the back side of the supporting substrate, and a portion of the flexible substrate is disposed on the back side of the supporting substrate. The plurality of electronic units are disposed within the display region. The conductive pattern layer extends from the display region to the portion of the flexible substrate, wherein the conductive pattern layer electrically connects at least two of the plurality of electronic units.

The feature of the present disclosure is to provide different electronic device tiling methods to form a larger area electronic apparatus. Each electronic device may have the same structure, so that it can be mass-produced, and then the electronic devices are tiled into a larger electronic apparatus. It has the advantages of simple process or cost saving.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 1A and FIG. 1B show the schematic diagrams of the basic structure of each electronic device in the present disclosure, wherein FIG. 1A represents a cross-sectional view of the electronic device, and FIG. 1B represents a top view of the electronic device.

FIG. 10A and FIG. 10B show the schematic diagrams of an electronic device according to a twelfth embodiment of the present disclosure, wherein FIG. 10A represents a top view of an electronic device, and FIG. 10B represents a cross-sectional view of the electronic device.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the touch display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

It should be noted that the technical features in different embodiments described in the following can be replaced, recombined, or mixed with one another to constitute another embodiment without departing from the spirit of the present disclosure.

Figure 1A:
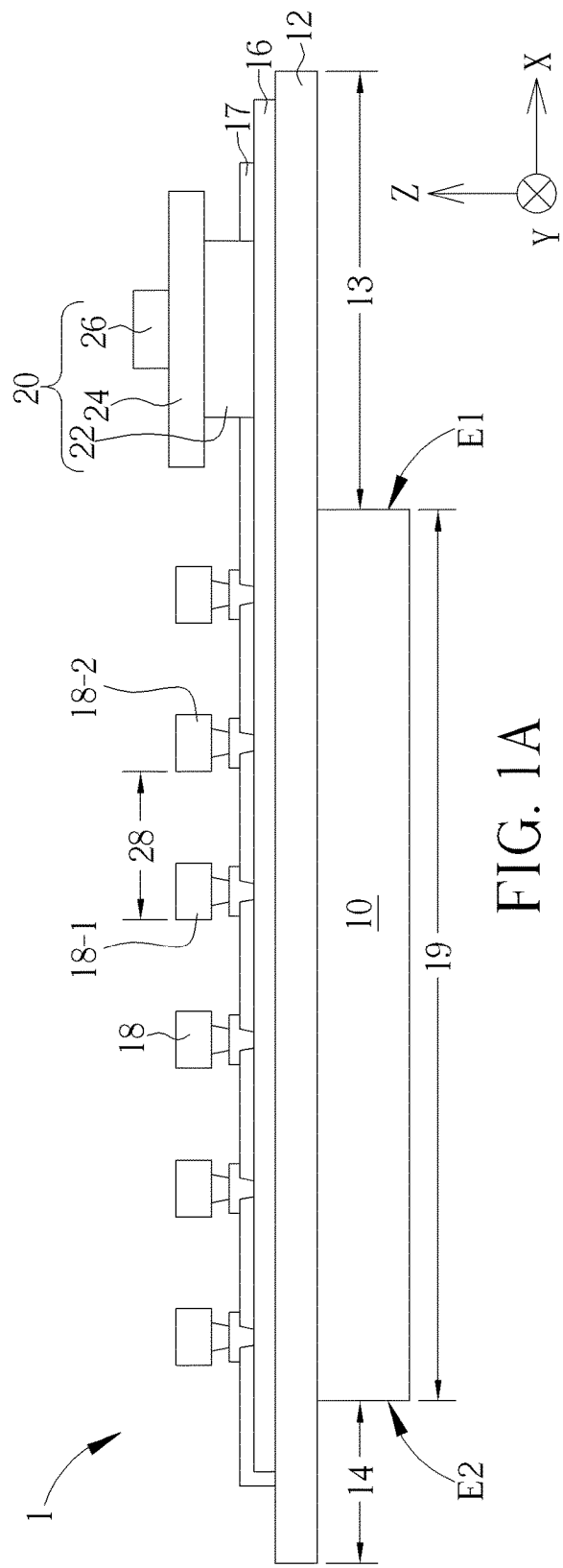
Figure 1B:
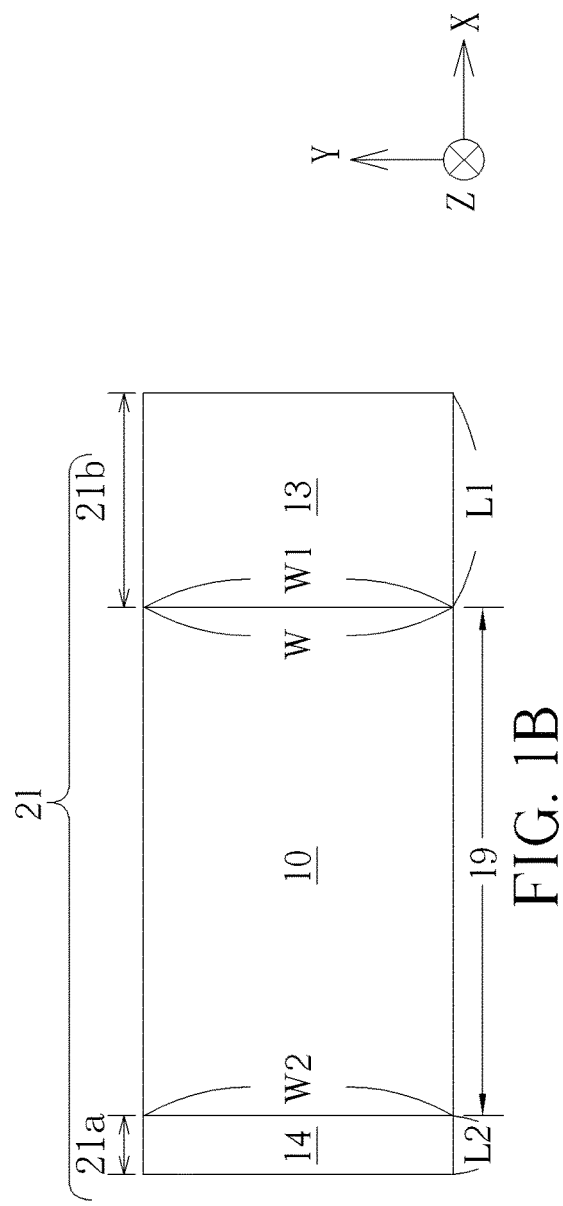

FIG. 1A and FIG. 1B show the basic structure of an electronic device 1 of the first embodiment in the present disclosure. In the present disclosure, an electronic device 1 is used to combine with other electronic devices to constitute a larger area of electronic apparatus for example, the electronic device comprise a display device, antenna device, sensor device, or combination thereto. In some embodiments, each of the electronic devices 1 may have the same structure, and thus can be fabricated by the same process, thereby achieving the advantage of simplifying the process. In one embodiment, the shapes of the electronic devices could be similar or different, and the shape of the electronic device could be in a rectangular, circle, polygon or free shape, when viewed in a top view of the electronic device 1. However, the disclosure is not limited thereto.

FIG. 1A represents a cross-sectional view of the electronic device 1, and FIG. 1B represents a top view of the electronic device 1. As shown in FIG. 1A, an electronic device 1 of the present disclosure comprises a supporting substrate 10 and a flexible substrate 12 disposed on the supporting substrate 10. In the present disclosure, the flexible substrate 12 has a larger area than the supporting substrate 10, so the flexible substrate 12 extends beyond at least two edges E1/E2 of the supporting substrate 10. More precisely, as shown in FIG. 1B, two regions are defined on the flexible substrate 12: a first extension region 13 and a second extension region 14, which extend beyond outwardly from a first edge E1 of the supporting substrate 10 and a second edge E2 of the supporting substrate 10 respectively, wherein the first edge E1 is opposite to the second edge E2. In some embodiments, when viewed in a top view (FIG. 1B) the first extension region 13 and the second extension region 14 are in rectangular shapes, but not limited thereto. In some embodiments, an area of the first extension region 13 is different from an area of the second extension region 14. In another embodiment, the area of the first extension region 13 could be larger than the area of the second extension region 14, but not limited thereto. In some embodiments of the present disclosure, an extension length L1 of the first extension region 13 is different from an extension length L2 of the second extension region 14. Besides, in this embodiment, a width W1 of the first extension region 13 is substantially equal to a width W2 of the second extension region 14 and a width W of the supporting substrate 10. However, the present disclosure is not limited thereto, and in another embodiment, the width W1 of the first extension region 13 may be different from the width W2 of the second extension region 14 or the width W of the supporting substrate 10 (the first edge E1 or the second edge E2).

The supporting substrate 10 may include rigid substrate or flexible substrate. The material of the rigid supporting substrate 10 may include glass, and the material of the flexible supporting substrate 10 may include glass, polyethylene terephthalate (PET), polycarbonate (PC), polyethylenenaphthalate (PEN), triacetate (TAC), phenolic cotton paper, woven glass, epoxy resin, aluminum nitride, silicon carbide or combinations thereof. The flexible substrate 12 may include glass having thinner thickness, copper foil, polyimide (PI), polycarbonate (PC), polyethylene naphthalate (PEN), triacetate (TAC), epoxy resin or combinations thereof. However, the present disclosure is not limited thereto, other suitable materials may be used as the materials of the supporting substrate 10 or the flexible substrate 12.

On the flexible substrate 12, a conductive pattern layer 16 and a protection layer 17 are formed, and a plurality of electronic units 18 are disposed on the flexible substrate 12 within a display region 19. The display region 19 is an area on the flexible substrate 12 that at least partially overlaps with the supporting substrate 10. In this embodiment, the display region 19 is an area other than the first extension region 13 and the second extension region 14 on the flexible substrate 12. In other words, the electronic units 18 disposed on the flexible substrate 12 excluding the first extension region 13 and the second extension region 14. In one embodiment, when the first extension region 13 or the second extension region 14 of the flexible substrate 12 has display function, the electronic units 18 may also disposed on the first extension region 13 or the second extension region 14 of the flexible substrate 12 extension region 13 extension region 14 (not drawing in FIG. 1A). The electronic units 18 may include light emitting diodes (LEDs), antenna units, sensor units, or other components such as display driver circuitry, one or more batteries, sensors, microphones, speakers, integrated circuits, microprocessors, power management units, radio-frequency transceiver circuitry, baseband processor circuitry, discrete components such as capacitors, resistors, and inductors, switches, vibrators, connectors, printed circuit boards, wires, transmission lines, and other electrical devices or combinations thereof, but the present disclosure is not limited thereto. In some embodiment, when the electronic units 18 is LED, the LED could be an organic LED or inorganic LED (such as quantum-dot LED, Mini-LED, or Micro-LED), and a type of LED could be a vertical type or flip-chip type, however, the disclosure is not limited thereto. In some embodiments, if the electronic units 18 is antenna units, the antenna unit could be a Radio Frequency Identification (RFID) antenna unit, a Near-field communication (NFC) antenna unit, a WiFi antenna unit, a Bluetooth antenna unit, a phased array antenna unit, or combinations thereof, but the present disclosure is not limited thereto Although the FIG. 1A shows each of the pitches 28 of the electronic units 18 are substantially the same, but at least part of the electronic units 18 also could be designed to have different pitches 28 from each other (not drawing in FIG. 1A), for example, the electronic units 18 closing to the first edge E1 or the second edge E2 are different from other electronic units 18 closing to a central position of supporting substrate 10, when an electronic device 1 is tiled to another electronic device 1 for getting a better display performance. The pitch 28 is defined as a distance between an edge of an electronic unit 18-1 and an edge of another electronic unit 18-2 closest to the electronic unit 18-1 along X-axis direction as shown in FIG. 1A.

The electronic units 18 are disposed on the flexible substrate 12 (the electronic units 18 can be formed on the flexible substrate 12 such as by wire bonding method or flip-chip method, or they can be connected together by magnetic force), and the electronic units 18 can be respectively electrically connected to the conductive pattern layer 16. In one embodiment, firstly, the electronic units 18 can be electrically connected to each other, and then electrically connected to the conductive pattern layer 16. The material of the conductive pattern layer 16 may include metal or transparent conductive material. Examples of the metal material include Mg, Al, Ag, W, Cu, Ni, Cr, or an alloy thereof. Examples of the transparent conductive material include indium tin oxide (ITO), indium zinc oxide (IZO), zinc oxide, or indium oxide. And the protection layer 17 can be used for protecting the conductive pattern layer 16 to avoid oxidation or damage, the protection layer 17 may include insulating materials, such as silicon oxide, silicon nitride, polyimide, epoxy resin or other suitable materials.

Furthermore, an external driving circuit 20 may be disposed in the first extension region 13 of the flexible substrate 12. In this embodiment, the external driving circuit 20 may include an integrated circuit (IC) 26 formed on a FPC (flexible printed circuit) 24, and electrically connected to the conductive pattern layer 16 by an anisotropic conductive film (ACF) 22. In one embodiment, the "dispose in" is defined as the external driving circuit 20 overlaps the first extension region 13, when viewed in viewed in a top view (Z-axis direction). The external driving circuit 20 is used to control the electronic units 18. For example, if the electronic units 18 include a light emitting diode, the external driving circuit 20 can be used to control whether the electronic units 18 are illuminating or not. Similarly, when the electronic units 18 include other components, the external driving circuit 20 can perform similar functions.

Figure 2:
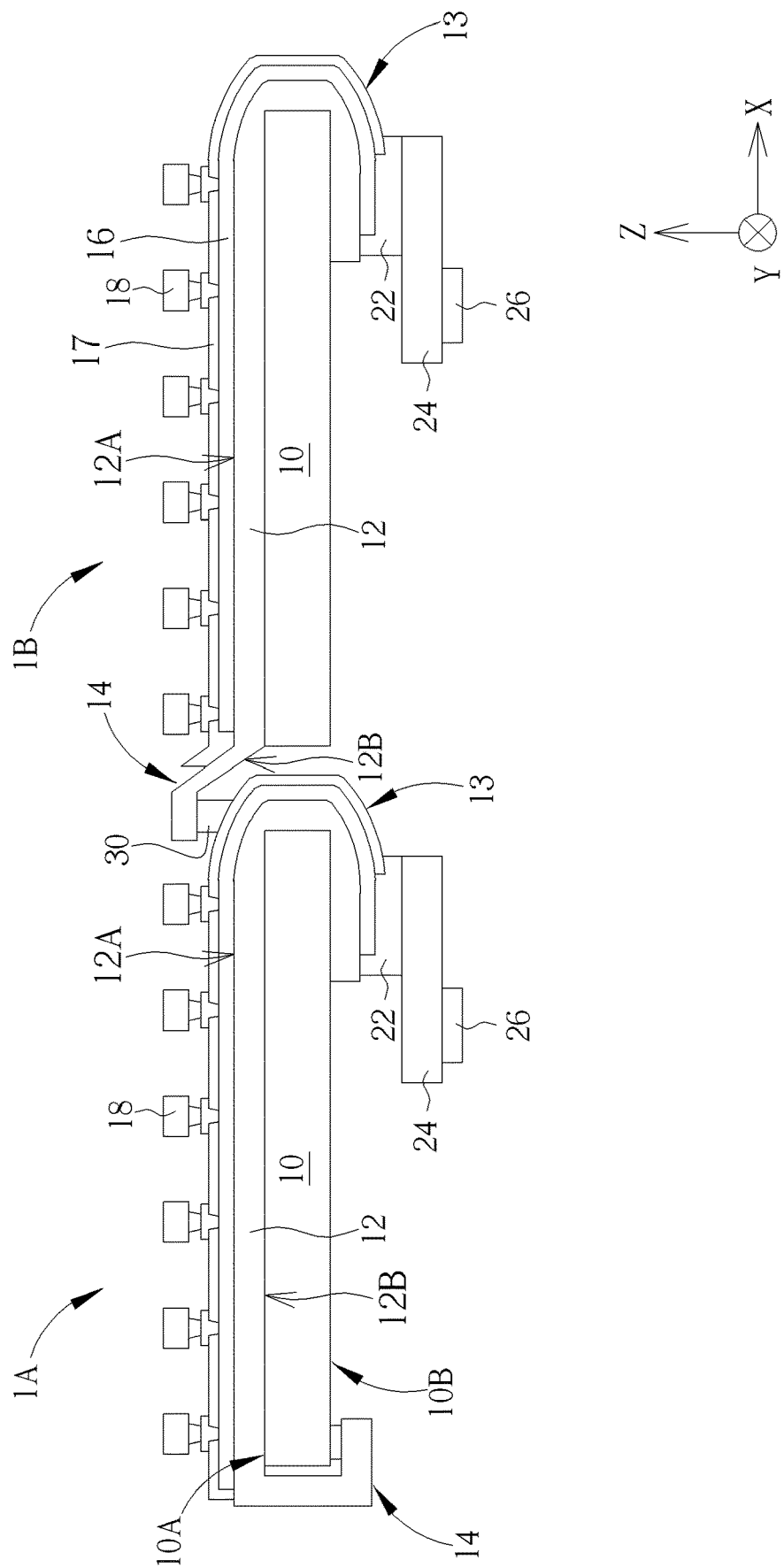
FIG. 2 shows the schematic diagram of an electronic device according to a second embodiment of the present disclosure.

In this embodiment, FIG. 2 shows that two electronic devices are provided, they are labeled as an electronic device 1A and an electronic device 1B respectively. Specifically, at least one of the first extension region 13 and the second extension region 14 of the electronic device 1A is used for tiling another electronic device 1B. It should be noted that the electronic device 1A and the electronic device 1B described herein each include the same components as the above electronic device 1 shown in FIG. 1, at least including the first extension region 13, the second extension region 14, the conductive pattern layer 16, the protection layer 17, the electronic units 18, the external driving circuit 20 and other components. To simplify the illustration, some components are not labeled in FIG. 2. However, the structures and functions of the components can be referred to the first embodiment described above.

Referring to FIG. 2, which shows the schematic diagram of an electronic device 1 according to a second embodiment of the present disclosure, the structure is formed by tiling at least two electronic devices 1 described in FIG. 1 above. It is worth noting that in some embodiments of the present disclosure, in order to reduce the border region of the electronic device 1, the external driving circuit 20 disposed on the first extension region 13 of the flexible substrate 12 may be selectively bent to the back side of the supporting substrate 10, the border region of the electronic device 1 mentioned here is defined as the area of the flexible substrate 12 that is not overlapping with the supporting substrate 10, for example, as shown in FIG. 1B above, a border region 21 includes a border region 21a and a border region 21b. As shown in FIG. 2, when viewed in a cross-sectional view, the supporting substrate 10 includes a front side 10A and a back side 10B disposed opposite to the front side 10A. The electronic units 18 described above are formed on the front side 10A of the supporting substrate 10, the first extension region 13 is partially disposed on the back side 10B, and the external driving circuit 20 is formed in the first extension region 13 of the flexible substrate 12. In other words, the external driving circuit 20 is formed on the back side 10B of the supporting substrate 10, so that the external driving circuit 20 will not occupy an area of the front side 10A of the supporting substrate 10, and the front side 10A of the supporting substrate 10 can accommodate more electronic units 18.

In this embodiment, the first extension region 13 of the electronic device 1A is tiled with the second extension region 14 of the electronic device 1B through a coupling member 30. In other words, the coupling member 30 is used for tiling another electronic device 1A/1B. The coupling member 30 may include a conductive or non-conductive adhesive, such as a glue layer or the ACF mentioned above. Besides, in this embodiment, the second extension region 14 of the electronic device 1A or the first extension region 13 of the electronic device 1B may be further tiled with other electronic devices. It should be noting that if the first extension region 13 or second extension region 14 of an electronic device 1A/1B is at the outermost boundary and will not tiled with other electronic devices, such as the second extension region 14 of the electronic device 1A, in this situation, the second extension region 14 of the electronic device 1A can be bent to the back side 10B of the supporting substrate 10 (as shown in FIG. 2) to avoid the second extension region 14 of the electronic device 1A from contacting other components or get a narrow border region of the electronic device 1A.

In addition, the electronic device 1A and an electronic device 1B mentioned above are tiled to each other along a first direction (such as the X-axis shown in FIG. 2), but the present disclosure is not limited to tile along only one direction, the electronic devices may be tiled to each other along other directions (such as along the Y-direction shown in FIG. 2). It should also be within the scope of the present disclosure.

Except for the features mentioned above, the other components, material properties, and manufacturing method of this embodiment are similar to the first embodiment detailed above and will not be redundantly described. In addition, the embodiments mentioned below also follow this rule, except for the differences that are specifically mentioned, the other features are the same as those described in the above first embodiment.

Figure 3:
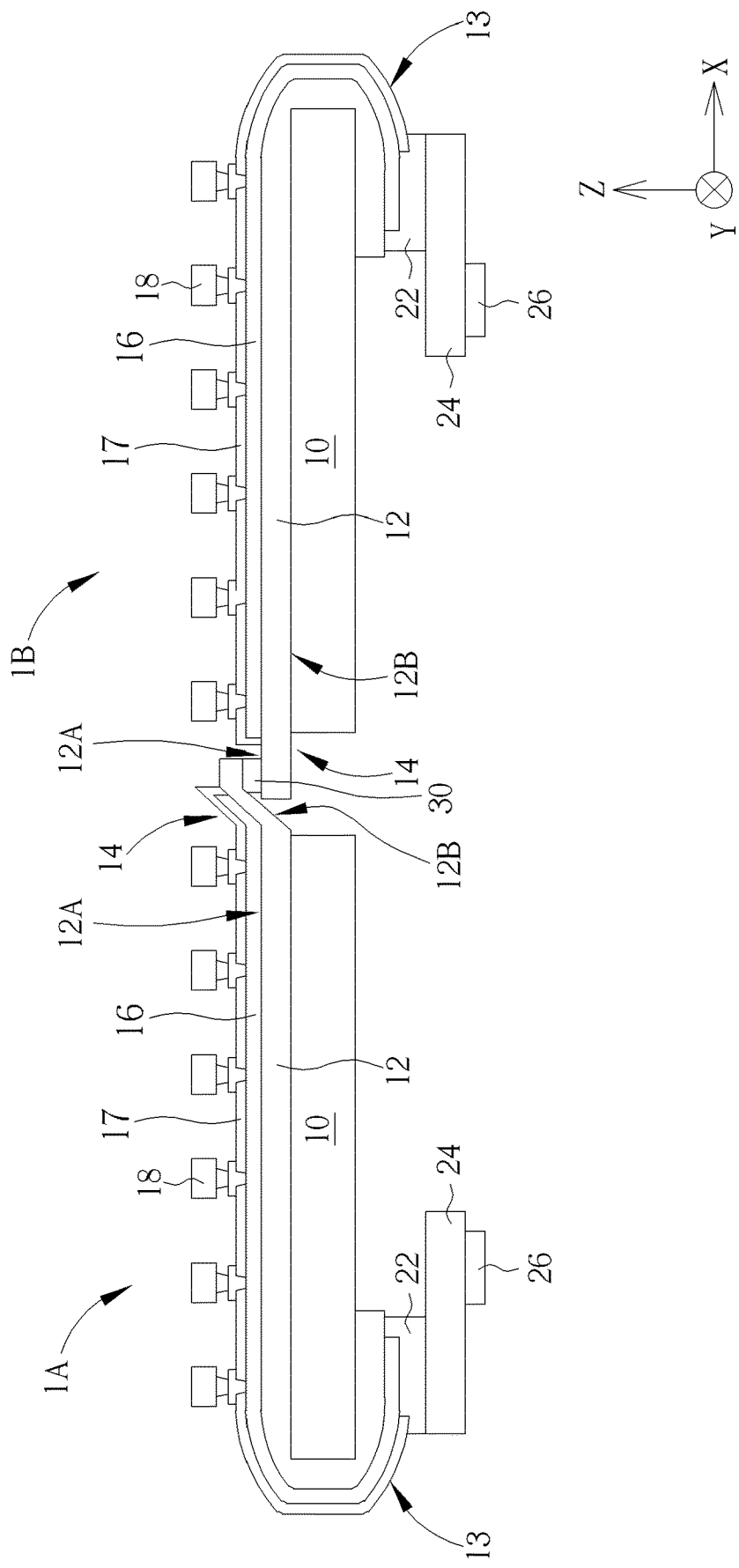
FIG. 3 shows the schematic diagram of an electronic device according to a third embodiment of the present disclosure.

Referring to FIG. 3, which shows the schematic diagram of an electronic device according to a third embodiment of the present disclosure. In this embodiment, the second extension region 14 of the electronic device 1A is tiled with the second extension region 14 of the electronic device 1B through the coupling member 30, and the coupling member 30 disposed between a back side 12B of the flexible substrate 12 of the electronic device 1A and a front side 12A of the flexible substrate 12 of the electronic device 1B along Z-axis direction.

Figure 4:
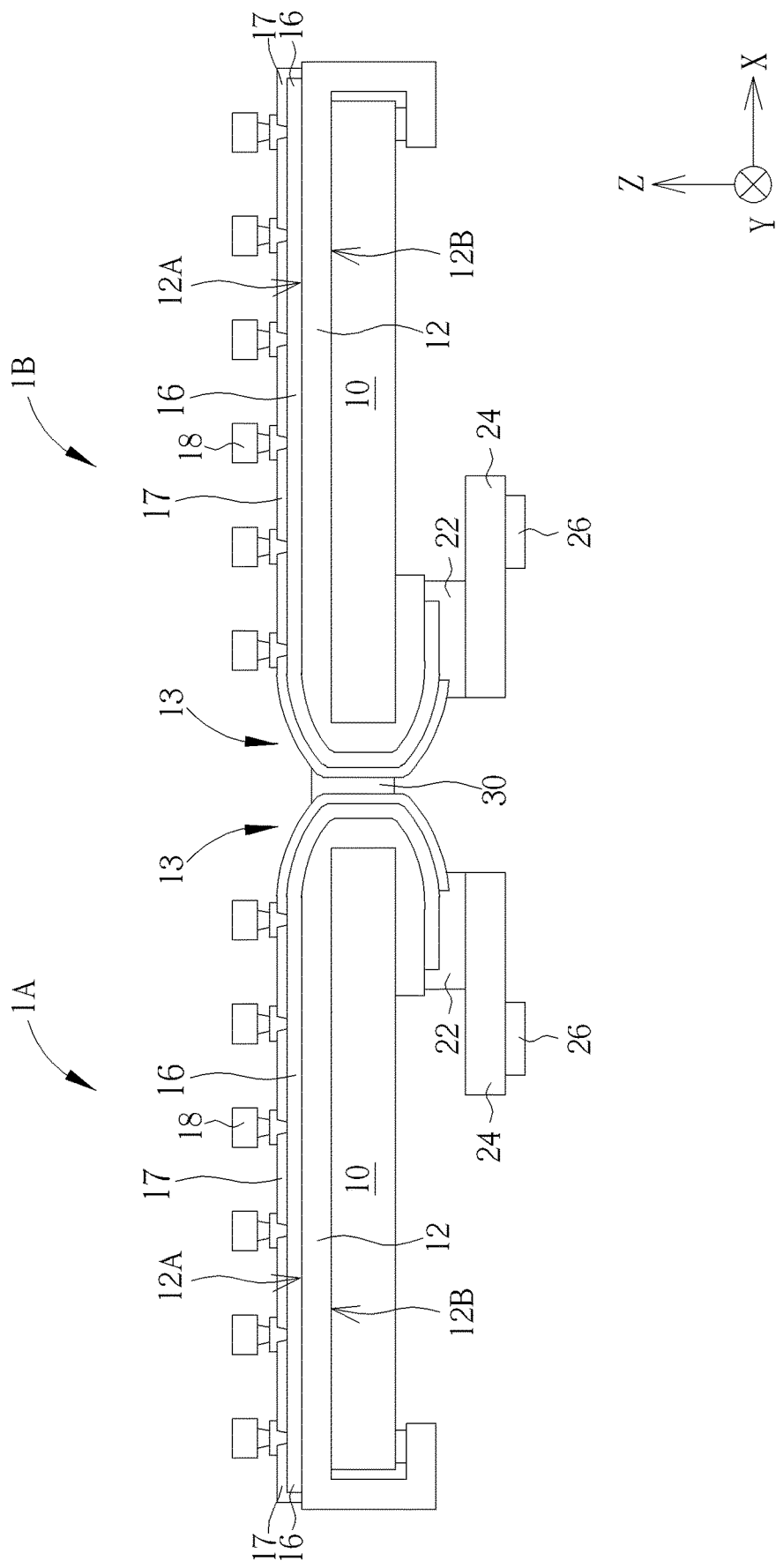
FIG. 4 shows the schematic diagram of an electronic device according to a fourth embodiment of the present disclosure.

Referring to FIG. 4, which shows the schematic diagram of an electronic device according to a fourth embodiment of the present disclosure. In this embodiment, the first extension region 13 of the electronic device 1A is tiled with the first extension region 13 of the electronic device 1B through the coupling member 30, and the coupling member 30 disposed between a front side 12A of the flexible substrate 12 of the electronic device 1A and a front side 12A of the flexible substrate 12 of the electronic device 1B. In another embodiment, the coupling member 30 can be disposed between a protection layer 17 of the electronic device 1A and a protection layer 17 of the electronic device 1B along X-axis direction. In addition, the coupling member 30 contacts the protection layer 17 of the electronic device 1A and the protection layer 17 of the electronic device 1B directly.

Figure 5:
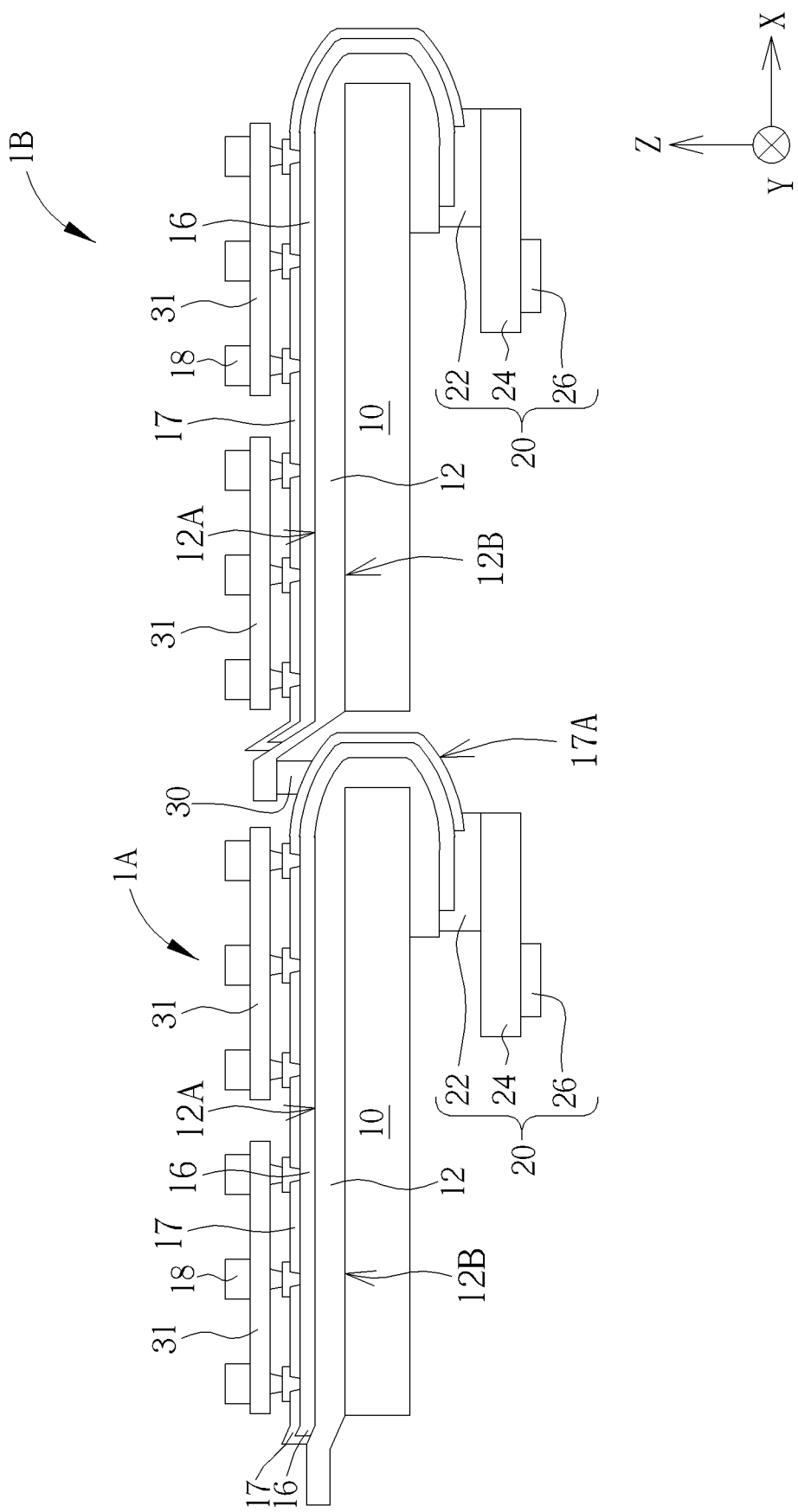
FIG. 5 shows the schematic diagram of an electronic device according to a fifth embodiment of the present disclosure.

Referring to FIG. 5, which shows the schematic diagram of an electronic device according to a fifth embodiment of the present disclosure. This embodiment is similar to the third embodiment mentioned above, but compared with the third embodiment mentioned above, in this embodiment, the electronic units 18 are divided into a plurality of groups, each group containing a specific number of electronic units 18, and the electronic units 18 are previously formed on a plurality of substrates 31, and the substrates 31 containing a plurality of electronic units 18 are then disposed on the flexible substrate 12 in the following steps.

By the method described in this embodiment, a plurality of substrates 31 including electronic units 18 can be completed in a process, or can be formed in some batch steps, since the substrate 31 has a larger area, so that the difficulty of the process can be reduced while the substrates 31 are disposed on the flexible substrate 12. The differences between this embodiment and the third embodiment mentioned above is that the embodiment further comprises a plurality of substrates 31 having the electronic units 18 disposed thereon. Besides, the coupling member 30 of this embodiment is disposed between a front side 17A of a protection layer 17 of the electronic device 1A and a back side 12B of the flexible substrate 12 of the electronic device 1B along the Z-axis. However, the present disclosure is not limited thereto, and the position of the coupling member 30 can be adjusted according to actual requirements.

In this embodiment, the electronic device 1A and the electronic device 1B are tiled in the same manner as described in FIG. 2 above, but the present disclosure is not limited thereto, and the electronic devices may also be tiled according to the tiling manner described in other embodiments (for example, FIGS. 2-4 or other tiling structures mentioned in the following paragraphs).

Figure 6:
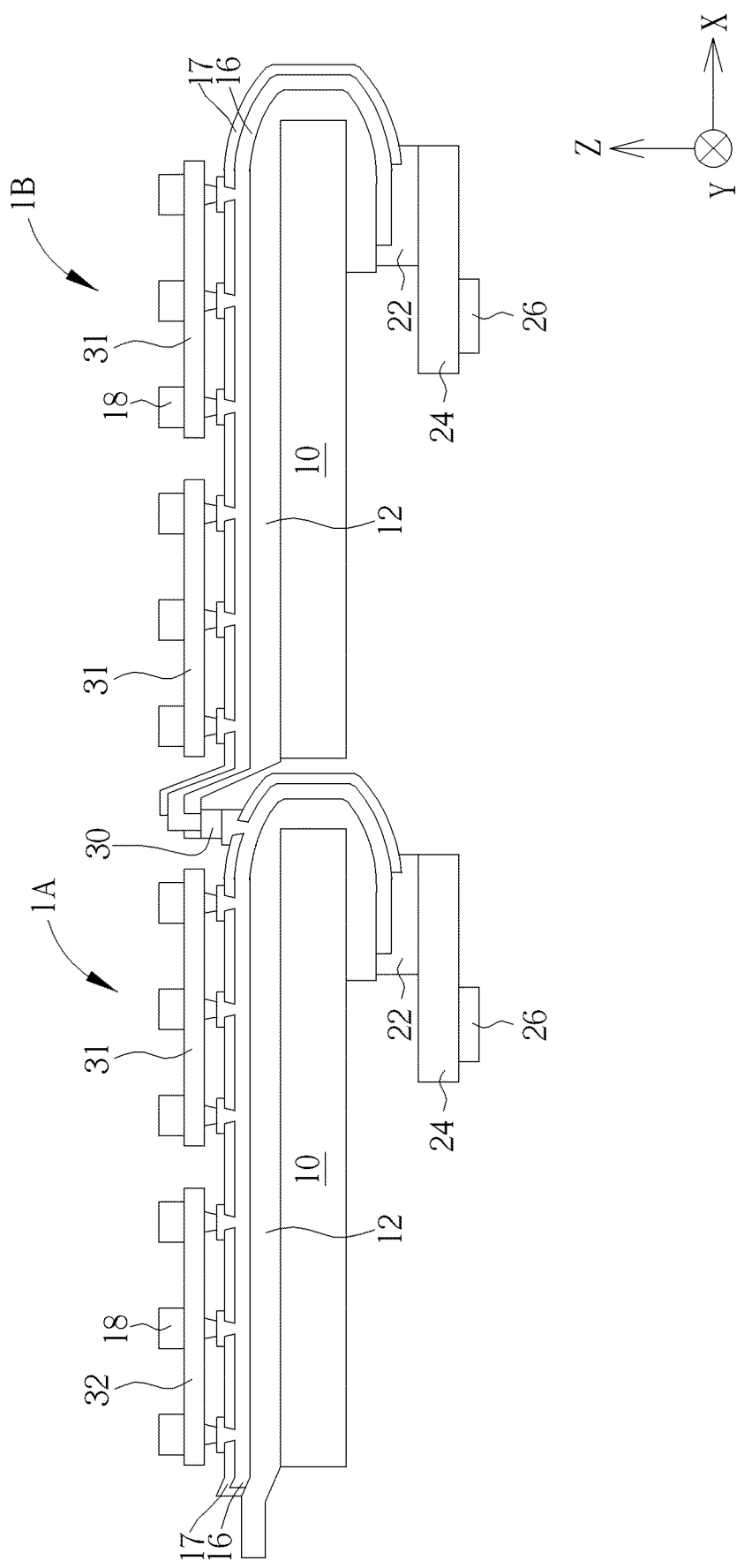
FIG. 6 shows the schematic diagram of an electronic device according to a sixth embodiment of the present disclosure.

Referring to FIG. 6, which shows the schematic diagram of an electronic device according to a sixth embodiment of the present disclosure. This embodiment is similar to the third embodiment and the fifth embodiment mentioned above, but compared with the third embodiment and the fifth embodiment mentioned above, in this embodiment, the coupling member 30 is made of conductive materials, and the conductive pattern layer 16 of the electronic device 1A and the conductive pattern layer 16 of the electronic device 1B are electrically connected to the conductive coupling member 30 respectively. In other words, the conductive pattern layer 16 of the electronic device 1A is electrically connected to the conductive pattern layer 16 of the electronic device 1B through the coupling member 30.

In this embodiment, take the electronic device 1A and the electronic device 1B as examples, since the conductive pattern layer 16 of the electronic device 1A is electrically connected to the conductive pattern layer 16 of the electronic device 1B, so only one external driving circuit 20 can control the electronic units 18 on the electronic device 1A and the electronic units 18 on the electronic device 1B simultaneously. In other words, another external driving circuit 20 can be omitted in this embodiment, to achieve cost savings. Or in another case, the external driving circuit 20 can still be reserved for use as a spare external driving circuit. It should also be within the scope of the present disclosure.

In this embodiment, the electronic device 1A and the electronic device 1B are tiled in the same manner as described in FIG. 2 above, but the present disclosure is not limited thereto, and the electronic devices may also be tiled according to the tiling manner described in other embodiments (for example, or other tiling structures mentioned in the following paragraphs).

The embodiments of the present disclosure described in the following paragraphs mainly focus on adjusting the shape of the flexible substrate, and the different shapes of the flexible substrate have different tiling structures. It is worth noting that FIG. 7 to FIG. 9 are shown in the top view. For the sake of simplicity, the components except the supporting substrate 10 and the flexible substrate are omitted, the material features and manufacturing methods of the remaining components are the same as those of the other embodiments described above, and are not described again.

Figure 7A:
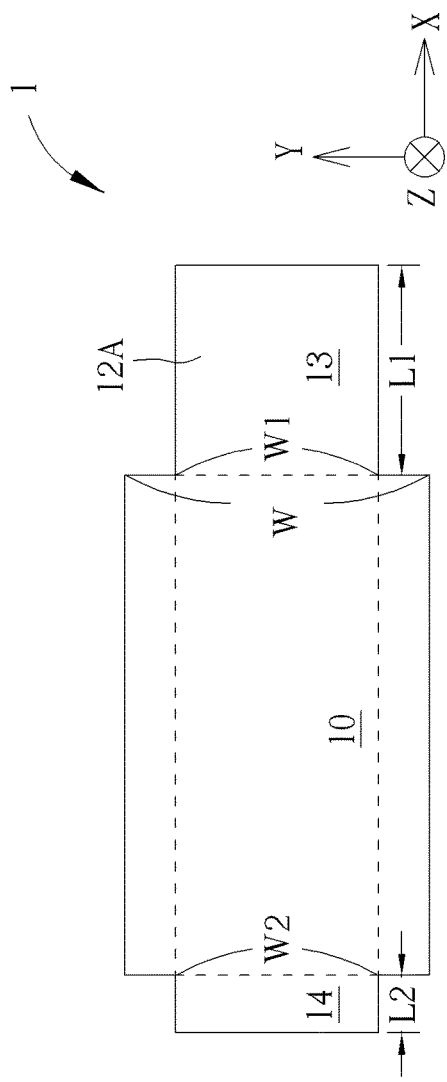
FIG. 7A shows the schematic diagram of an electronic device according to a seventh embodiment of the present disclosure.

Referring to FIG. 7A, which shows the schematic diagram of an electronic device 1 according to a seventh embodiment of the present disclosure. As shown in FIG. 7A, a flexible substrate 12A is formed and at least partially overlaps the supporting substrate 10 when viewed in a top view. However, FIG. 7A shows that the width W1 of the first extension region 13 and the width W2 of the second extension region 14 are substantially the same, and smaller than the width W of the supporting substrate 10. In one embodiment, an area of the first extension region 13 is larger than an area of the second extension region 14, and both of areas of the first extension region 13 and the second extension region 14 are smaller than an area of the supporting substrate 10. In this disclosure, the length L1/L2 or the width W1/W2 of each extension region (including the first extension region 13 and the second extension region 14) can be adjusted according to actual requirements.

Figure 7B:
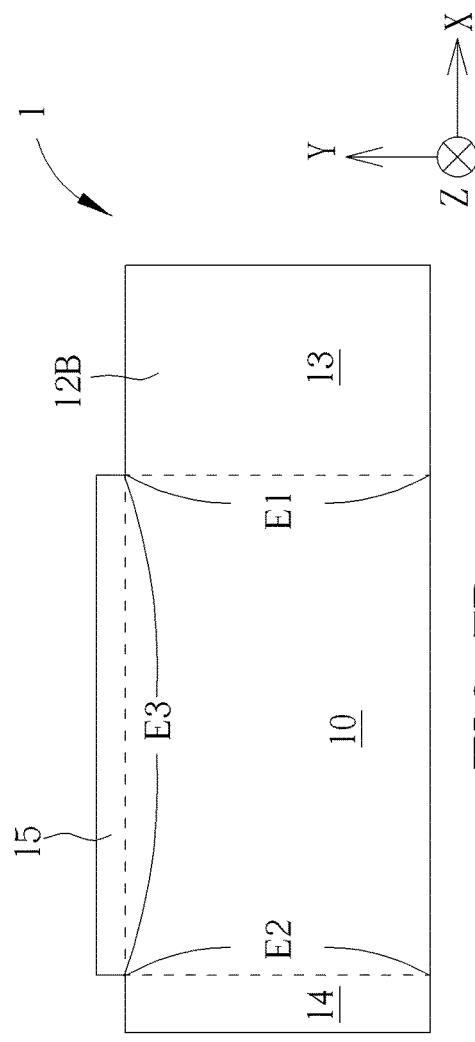
FIG. 7B shows the schematic diagram of an electronic device according to an eighth embodiment of the present disclosure.

Referring to FIG. 7B, which shows the schematic diagram of an electronic device 1 according to an eighth embodiment of the present disclosure. As shown in FIG. 7B, a flexible substrate 12B is formed and at least partially overlaps the supporting substrate 10. However, in this embodiment, the flexible substrate 12B further comprises a third extension region 15 extends beyond a third edge E3 of the supporting substrate 10. The third edge E3 is disposed adjacent to the first edge E1 and the second edge E2, and the first edge E1 is opposite to the second edge E2 along X-axis direction. The third extension region 15 can be used to tile with another electronic device along Y-axis direction. In addition, in another embodiment of the present disclosure, a fourth extension region (not shown) may be further formed, disposed opposite to the third extension edge E3 along Y-axis direction. It should also be within the scope of the present disclosure.

Figure 8A:
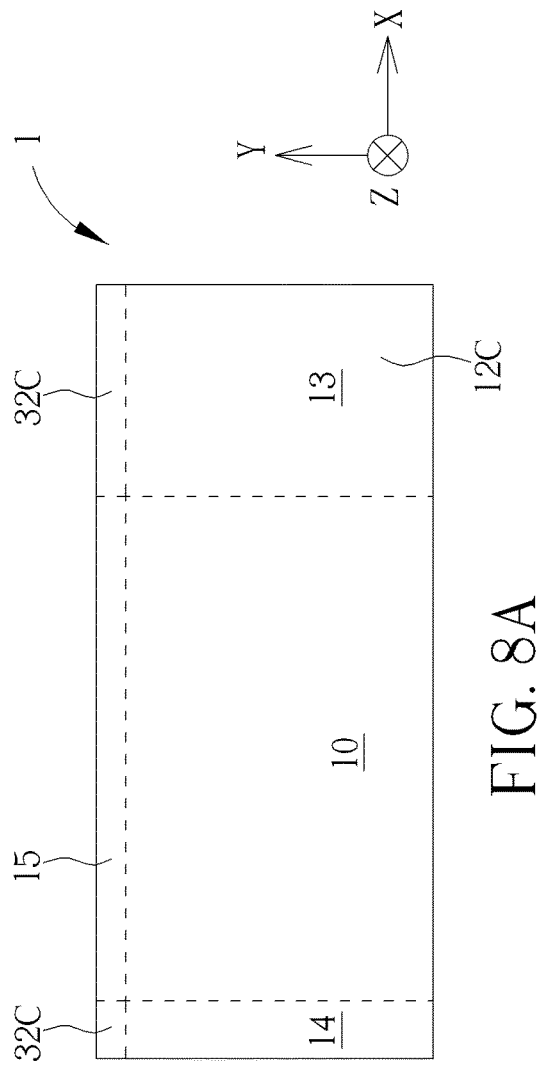
FIG. 8A shows the schematic diagram of an electronic device according to a ninth embodiment of the present disclosure.
Figure 9:
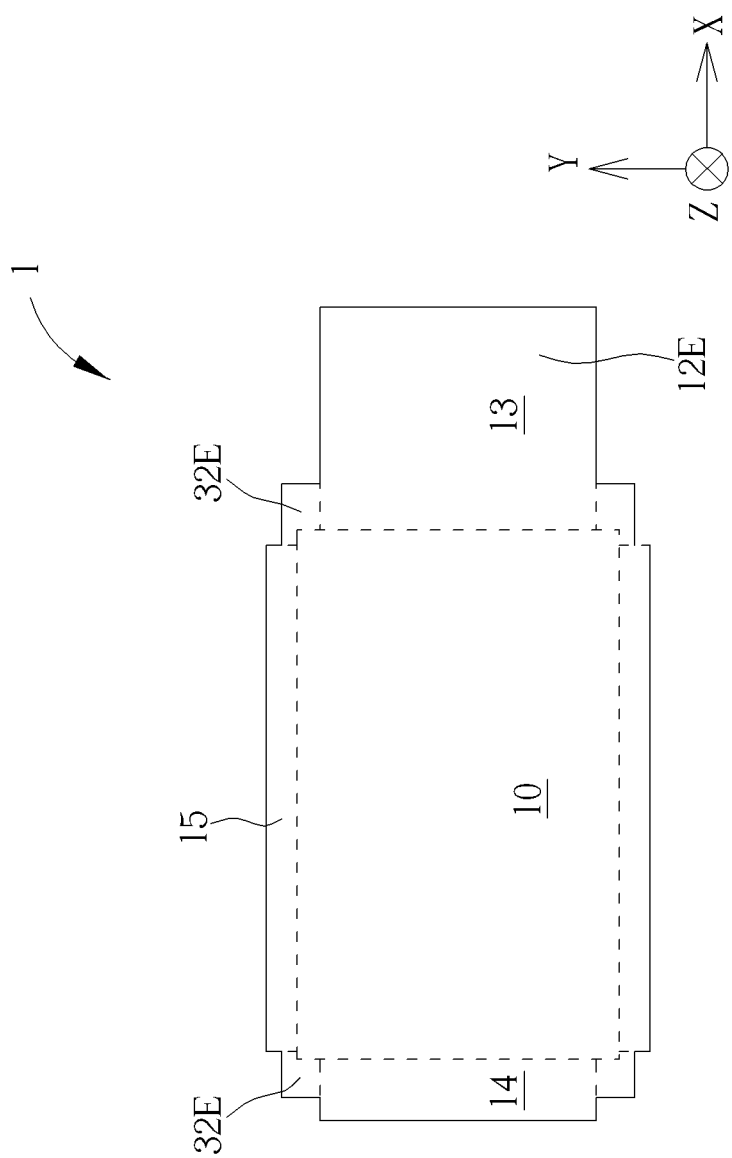
FIG. 9 shows the schematic diagram of an electronic device according to an eleventh embodiment of the present disclosure.

Referring to FIG. 8A, which shows the schematic diagram of an electronic device 1 according to a ninth embodiment of the present disclosure. As shown in FIG. 8A, a flexible substrate 12C is formed and at least partially overlaps the supporting substrate 10. However, in this embodiment, the flexible substrate 12C further comprises at least one corner extension region 32C, in this embodiment, two corner extension regions 32C disposed adjacent to the third extension region 15 and the first extension region 13, and disposed adjacent to the third extension region 15 and the second extension region 14 respectively. In one embodiment, one of the corner extension regions 32C directly connects the third extension region 15 and the first extension region 13, and the other corner extension regions 32C contacts the third extension region 15 and the second extension region 14 directly. Besides, both the two corner extension regions 32C are rectangular patterns.

Figure 8B:
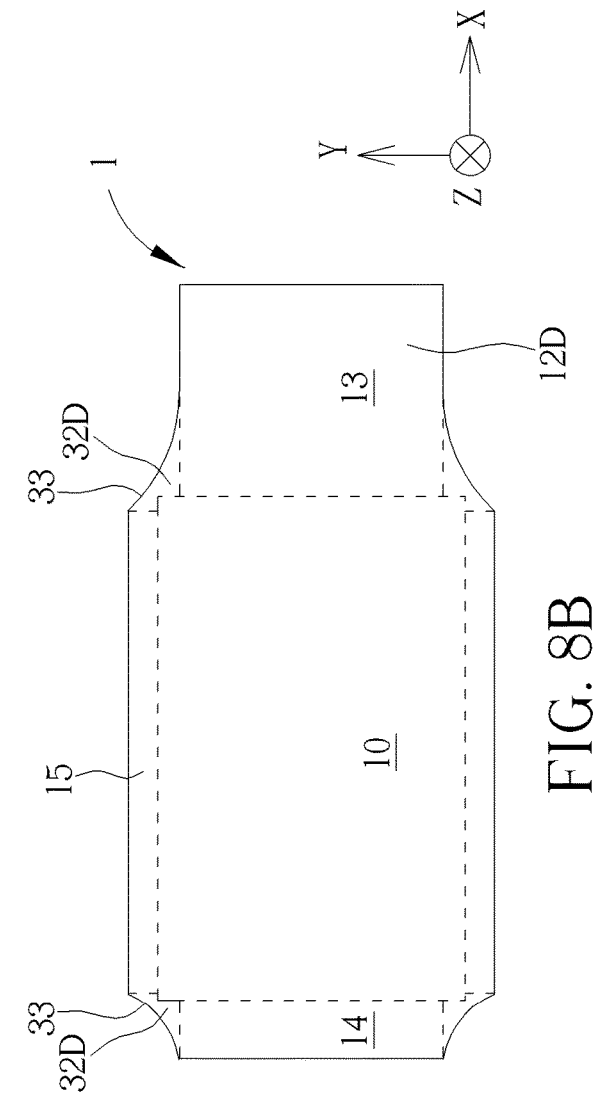
FIG. 8B shows the schematic diagram of an electronic device according to a tenth embodiment of the present disclosure.

Referring to FIG. 8B, which shows the schematic diagram of an electronic device 1 according to a tenth embodiment of the present disclosure. As shown in FIG. 8B, a flexible substrate 12D is formed and at least partially overlaps the supporting substrate 10. However, in this embodiment, the flexible substrate 12D further comprises at least one corner extension region 32D, in this embodiment, at least two corner extension regions 32D disposed adjacent to the third extension region 15 and the first extension region 13, and disposed adjacent to the third extension region 15 and the second extension region 14 respectively. In one embodiment, one of the corner extension regions 32D contacts the third extension region 15 and the first extension region 13 directly, and the other corner extension regions 32D directly connects the third extension region 15 and the second extension region 14. Besides, both the two corner extension regions 32D have at least one curved hypotenuse (such as the curved hypotenuse 33 shown in FIG. 8B). In one embodiment of the present disclosure, the corner extension regions 32D can be a triangle shaped pattern but has an inwardly curved hypotenuse, and in another embodiment of the present disclosure, the corner extension regions 32D can be a triangle shaped pattern but has an outwardly curved hypotenuse.

Referring to FIG. 9, which shows the schematic diagram of an electronic device 1 according to an eleventh embodiment of the present disclosure. As shown in FIG. 9, a flexible substrate 12E is formed and at least partially overlaps the supporting substrate 10. However, in this embodiment, the flexible substrate 12E further comprises at least one corner extension region 32E, in this embodiment, two corner extension regions 32E disposed adjacent to the third extension region 15 and the first extension region 13, and disposed adjacent to the third extension region 15 and the second extension region 14 respectively. In one embodiment, one of the corner extension regions 32E contacts the third extension region 15 and the first extension region 13 directly, and the other corner extension regions 32E directly connects the third extension region 15 and the second extension region 14. Besides, both the two corner extension regions 32 are L-shaped patterns.

Figure 10A:
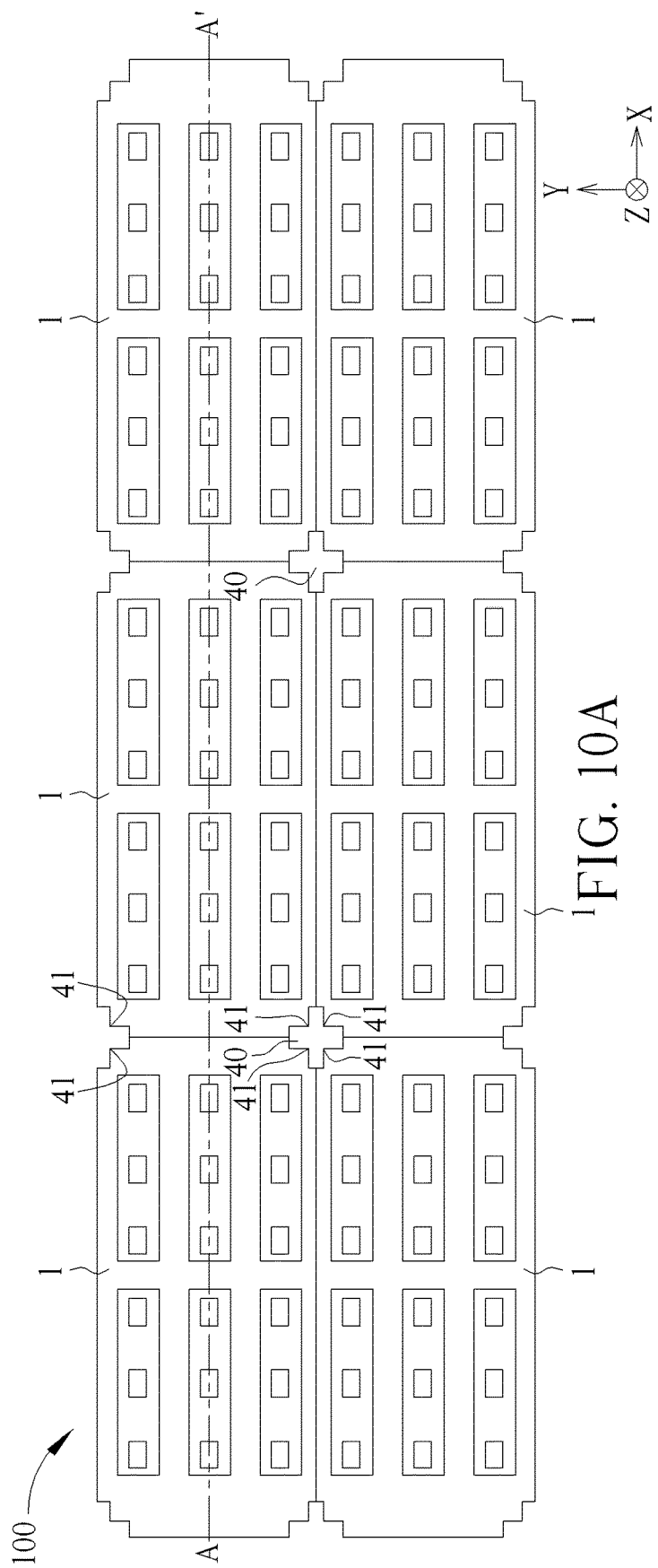
Figure 10B:
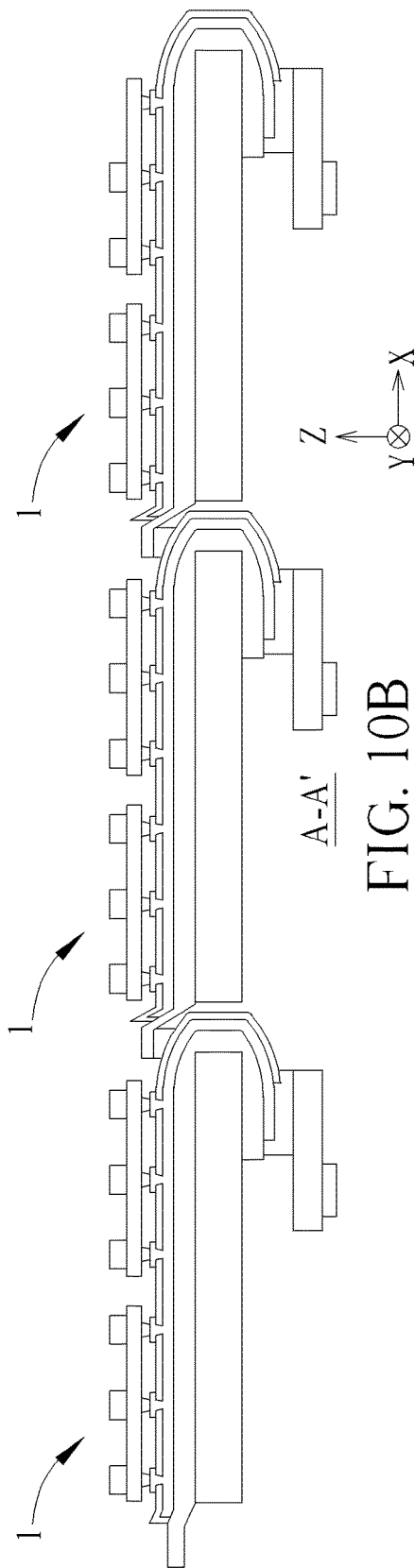

Referring to FIG. 10A and FIG. 10B, which show the schematic diagrams of an electronic device according to a twelfth embodiment of the present disclosure. This embodiment shows a schematic diagram of a plurality of electronic devices tiled into a larger area electronic apparatus 100, FIG. 10A represents a top view of the electronic device 100, and FIG. 10B is a cross-sectional view taken along a section line A-A'. As shown in FIG. 10A, a plurality of electronic devices 1 are arranged in array and tiled to each other, each electronic device 1 can be tiled with another electronic device 1 along different directions (such as the X-axis direction or the Y-axis direction of FIG. 10B). It should be noted that the electronic device 1 described in FIG. 10A or FIG. 10B may be replaced by the electronic devices described in any of the foregoing embodiments, and the present disclosure is not limited thereto. Besides, in one embodiment of the present disclosure, a larger area electronic apparatus is not limited to be tiled with only one tiling method. In other words, a larger area electronic apparatus can be tiled by a plurality of electronic devices with different tiling methods (such as the tiling methods mentioned in each embodiment above).

In addition, in this embodiment, corners 41 are defined, and each corner 41 is disposed between every two adjacent edges of the flexible substrate 12 of the electronic device 1, and the two adjacent edges have different extending direction, for example, one extending direction is along the X-axis direction, and another extending direction is along the Y-axis direction. The corners 41 of each electronic device 1 are chamfered, therefore, a gap 40 will be left at the boundary of every four electronic devices 1, or between the corners of every two adjacent electronic devices, in other words, at least one gap 40 is between a corner 41 of one electronic device 1 and a corner 41 of another electronic device 1. In this embodiment, the gap 40 is defined as the area that is not covered by the flexible substrate 12. The purpose of leaving the gap 40 is that after the electronic apparatus is completed, the electronic apparatus is a flexible device. When the electronic apparatus is bent, the corners of each electronic device are more easily contacted with the corners of other adjacent electronic devices. It may even cause damage to some electronic devices. Therefore, in this embodiment, the gaps 40 are leaved, and the issue mentioned above can be prevented. Besides, in this embodiment, when viewed from a top view, the gap 40 is a cross pattern, however, the present disclosure is not limited thereto, and the shape of each gap can be adjusted according to actual requirements.

In summary, the feature of the present disclosure is to provide different electronic device tiling methods to form a larger area electronic apparatus. The electronic devices may have the same structure, so that it can be mass-produced, and then the electronic devices are tiled into a larger electronic apparatus. It has the advantages of simple process or cost saving.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. An electronic apparatus, comprising:
an electronic device tiled with another electronic device, each of the electronic device and the another electronic device comprising:
a supporting substrate comprising a front side and a back side opposite to the front side;
a flexible substrate disposed on the supporting substrate,
wherein the supporting substrate comprises a first edge, a second edge, and a third edge disposed adjacent to the first edge and the second edge, the first edge and the second edge extends along a first direction, and the third edge extends along a second direction different from the first direction, wherein the flexible substrate extends beyond the first edge to define a first extension region, the flexible substrate extends beyond the second edge to define a second extension region, and the flexible substrate extends beyond the third edge to define a third extension region, wherein the first extension region comprises a fourth edge extending along the first direction, and the third extension region comprises a fifth edge extending along the second direction, wherein the flexible substrate comprises a corner extension region disposed between and connecting the first extension region and the third extension region, and the corner extension region comprises an edge not aligned with the fourth edge of the first extension region and not aligned with the fifth edge of the third extension region, wherein the flexible substrate includes a display region excluding the first extension region and the second extension region, wherein the flexible substrate is bent from the front side to the back side of the supporting substrate, and a portion of the flexible substrate is disposed on the back side of the supporting substrate;

a plurality of electronic units disposed on the flexible substrate and within the display region; and a conductive pattern layer disposed on the flexible substrate and extending from the display region to the portion of the flexible substrate, wherein the conductive pattern layer electrically connects at least two of the plurality of electronic units, wherein the electronic device further comprises a coupling member disposed on the first extension region of the flexible substrate for tiling the electronic device and the another electronic device, wherein the coupling member is disposed between a front side of the flexible substrate of the electronic device and a back side of the flexible substrate of the another electronic device, wherein the coupling member is a conductive coupling member, the flexible substrate of the another electronic device comprises a via, a portion of the conductive pattern layer of the another electronic device is disposed in the via, and the conductive pattern layer of the electronic device is electrically connected to the conductive pattern layer of the another electronic device through the portion of the conductive pattern layer disposed in the via and through the conductive coupling member.

2. The electronic apparatus according to claim 1, wherein each of the electronic device and the another electronic device comprises a first substrate disposed on the flexible substrate, wherein a first group of the plurality of electronic units are disposed on the first substrate, and the first substrate is disposed between the first group of the plurality of electronic units and the flexible substrate.

3. The electronic apparatus according to claim 2, wherein each of the electronic device and the another electronic device comprises a second substrate disposed on the flexible substrate, wherein a second group of the plurality of electronic units are disposed on the second substrate, the second substrate is disposed between the second group of the plurality of electronic units and the flexible substrate, and an interval is formed between the first substrate and the second substrate, wherein in each of the electronic device and the another electronic device, the conductive pattern layer electrically connects at least one electronic unit of the first group and at least one electronic unit of the second group.

4. The electronic apparatus according to claim 1, wherein the plurality of electronic units comprise light emitting diodes, antenna units, sensor units, or combinations thereof.

5. The electronic apparatus according to claim 1, wherein a material of the conductive pattern layer is metal.

6. The electronic apparatus according to claim 1, wherein a material of the conductive pattern layer is transparent conductive material.

7. The electronic apparatus according to claim 1, wherein the edge of the corner extension region of the flexible substrate is curved.

8. The electronic apparatus according to claim 1, wherein the conductive pattern layer overlaps the at least two of the plurality of electronic units.

* * * * *